US009971254B2

(12) United States Patent
Laurent et al.

(10) Patent No.: US 9,971,254 B2
(45) Date of Patent: May 15, 2018

(54) SENSOR, LITHOGRAPHIC APPARATUS AND DEVICE MANUFACTURING METHOD

(71) Applicant: ASML Netherlands B.V., Veldhoven (NL)

(72) Inventors: Thibault Simon Mathieu Laurent, Eindhoven (NL); Johannes Henricus Wilhelmus Jacobs, Heeze (NL); Haico Victor Kok, Veldhoven (NL); Yuri Johannes Gabriël Van De Vijver, Best (NL); Johannes Antonius Maria Van De Wal, Oirschot (NL); Bastiaan Andreas Wilhelmus Hubertus Knarren, Nederweert-Eind (NL); Robbert-Jan Voogd, Neerpelt (BE); Jan Steven Christiaan Westerlaken, Heesch (NL); Johannes Hubertus Antonius Van De Rijdt, Gemert (NL); Allard Eelco Kooiker, Waalre (NL); Wilhelmina Margareta Jozef Hurkens-Mertens, Montfort (NL); Yohann Bruno Yvon Teillet, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days. days.

(21) Appl. No.: 15/694,519

(22) Filed: Sep. 1, 2017

(65) Prior Publication Data

US 2017/0363964 A1 Dec. 21, 2017

Related U.S. Application Data

(63) Continuation of application No. 14/397,126, filed as application No. PCT/EP2013/055701 on Mar. 19, 2013, now Pat. No. 9,753,382.

(Continued)

(51) Int. Cl.
*G03B 27/52* (2006.01)
*G03B 27/58* (2006.01)
(Continued)

(52) U.S. Cl.
CPC ........ *G03F 7/7085* (2013.01); *G03F 7/70341* (2013.01); *G03F 7/70666* (2013.01); *G03F 7/70858* (2013.01); *G03F 7/70891* (2013.01)

(58) Field of Classification Search
CPC ............ G03F 7/70341; G03F 7/70616; G03F 7/70666; G03F 7/7085; G03F 7/70858; G03F 7/70891
(Continued)

(56) References Cited

U.S. PATENT DOCUMENTS 8,013,977 B2 9/2011 Kok et al.
9,753,382 B2* 9/2017 Laurent ............... G03F 7/70341
(Continued)

FOREIGN PATENT DOCUMENTS

CN 101109908 A 1/2008
JP 2003-068626 3/2003
(Continued)

OTHER PUBLICATIONS

International Search Report dated Jun. 28, 2013 in corresponding International Patent Application No. PCT/2013/055701.
(Continued)

*Primary Examiner* — Colin Kreutzer
(74) *Attorney, Agent, or Firm* — Pillsbury Winthrop Shaw Pittman, LLP

(57) ABSTRACT

A sensor for use in lithographic apparatus of an immersion type and which, in use, comes into contact with the immersion liquid is arranged so that the thermal resistance of a first heat path from a transducer of the sensor to a temperature conditioning device is less than the thermal resistance of a
(Continued)

second heat flow path from the transducer to the immersion liquid. Thus, heat flow is preferentially towards the temperature conditioning device and not the immersion liquid so that temperature-induced disturbance in the immersion liquid is reduced or minimized.

20 Claims, 6 Drawing Sheets

Related U.S. Application Data

(60) Provisional application No. 61/736,264, filed on Dec. 12, 2012, provisional application No. 61/650,260, filed on May 22, 2012.

(51) Int. Cl.
*G03B 27/74* (2006.01)
*G03F 7/20* (2006.01)

(58) Field of Classification Search
USPC .................................. 355/30, 67, 68, 72, 77
See application file for complete search history.

(56) References Cited

U.S. PATENT DOCUMENTS

| | | |
|---|---|---|
| 2004/0207824 A1 | 10/2004 | Lof et al. |
| 2006/0018644 A1 | 1/2006 | Stavely |
| 2006/0038968 A1 | 2/2006 | Kemper et al. |
| 2006/0181690 A1 | 8/2006 | Nishinaga et al. |
| 2007/0102631 A1 | 5/2007 | Pucher et al. |
| 2007/0108377 A1 | 5/2007 | Kok et al. |
| 2007/0139632 A1 | 6/2007 | Shiraishi et al. |
| 2008/0013059 A1 | 1/2008 | Kok et al. |
| 2010/0259734 A1 | 10/2010 | Knarren et al. |
| 2011/0222033 A1* | 9/2011 | Ten Kate ............ G03F 7/70875 355/30 |
| 2011/0249245 A1 | 10/2011 | Janssen et al. |
| 2012/0075607 A1 | 3/2012 | Knarren et al. |

FOREIGN PATENT DOCUMENTS

| | | |
|---|---|---|
| JP | 2003-68626 A | 3/2003 |
| JP | 2008-028386 | 2/2008 |
| JP | 2010-245572 | 10/2010 |
| KR | 10-2007-0122442 | 12/2007 |
| WO | 99/49504 | 9/1999 |

OTHER PUBLICATIONS

Korean Office Action dated Apr. 3, 2016 in corresponding Korean Patent Application No. 10-2014-7035865.
First Office Action issued in corresponding Chinese Patent Application No. 201610987008.0 dated Nov. 23, 2017 with English translation.

* cited by examiner

SENSOR, LITHOGRAPHIC APPARATUS AND DEVICE MANUFACTURING METHOD

CROSS-REFERENCE TO RELATED APPLICATIONS

This application is a continuation of U.S. patent application Ser. No. 14/397,126, filed on Oct. 24, 2014, which is the U.S. national phase entry of PCT patent application no. PCT/EP2013/055701, which was filed on Mar. 19, 2013, which claims the benefit of priority of U.S. provisional application No. 61/650,260, which was filed on May 22, 2012, and also of U.S. provisional application No. 61/736,264, which was filed on Dec. 12, 2012, each of which are incorporated herein in its entirety by reference.

FIELD

The present invention relates to a sensor, a lithographic apparatus having the sensor and a device manufacturing method using such an apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In a lithography apparatus, one or more sensors are provided to measure a property of the projection beam at substrate level. For example, a transmission image sensor can be used to determine the position of the substrate table and hence the substrate relative to a projected image of a marker from a patterning device. An integrated interferometer can be used to measure aberrations in the wave front of the projected beam.

Such a sensor generally includes a photodiode or camera as well as electronic circuitry, e.g. to process or amplify signals output by the photodiode or camera. The photodiode or camera and electronic circuitry generates heat when in use. The heat generated by the sensor can form an unwanted disturbance on the accurate imaging used to form precision devices.

It is desirable, for example, to provide an improved sensor for use in a lithographic apparatus which reduces, desirably minimizes, disturbances of the imaging process.

According to an aspect of the invention, there is provided a sensor for use in a lithographic apparatus of an immersion type, the sensor comprising: a member that, in use of the sensor, contacts an immersion liquid supplied to a space adjacent an element of a projection system; a transducer configured to convert a stimulus to an electric signal; and a temperature conditioning device, wherein a first heat flow path between the transducer and the temperature conditioning device has a lower thermal resistance than a second heat flow path between the transducer and the immersion liquid.

According to an aspect of the invention, there is provided a sensor for use in an immersion lithographic apparatus, the sensor comprising: a surface of a member that, in use of the sensor, contacts an immersion liquid supplied to a space adjacent an element of a projection system; a transducer configured to convert a stimulus to an electric signal; and a temperature conditioning device, wherein the transducer is thermally coupled to the temperature conditioning device and the transducer is thermally isolated from the surface of the member.

According to an aspect of the invention, there is provided a sensor for use in an immersion lithographic apparatus, the sensor comprising: a surface of a member that, in use of the sensor, contacts an immersion liquid supplied to a space adjacent an element of a projection system; a transducer configured to convert a stimulus to an electric signal; and a temperature conditioning device, wherein the transducer has greater thermal coupling to the temperature conditioning device than the transducer to the surface of the member.

According to an aspect of the invention, there is provided a sensor for use in an immersion lithographic apparatus, the sensor comprising: a surface of a member that, in use of the sensor, contacts an immersion liquid supplied to a space adjacent an element of a projection system; a transducer configured to convert a stimulus to an electric signal; and a temperature conditioning device, wherein the transducer has greater thermal isolation from the surface of the member than from the temperature conditioning device.

According to an aspect of the invention, there is provided a lithographic apparatus, comprising: a support structure configured to support a patterning device; a projection system configured to project a beam patterned by the patterning device onto a substrate; a substrate table configured to support the substrate; a liquid supply system configured to provide a liquid to a space between the projection system and the substrate; and a sensor as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
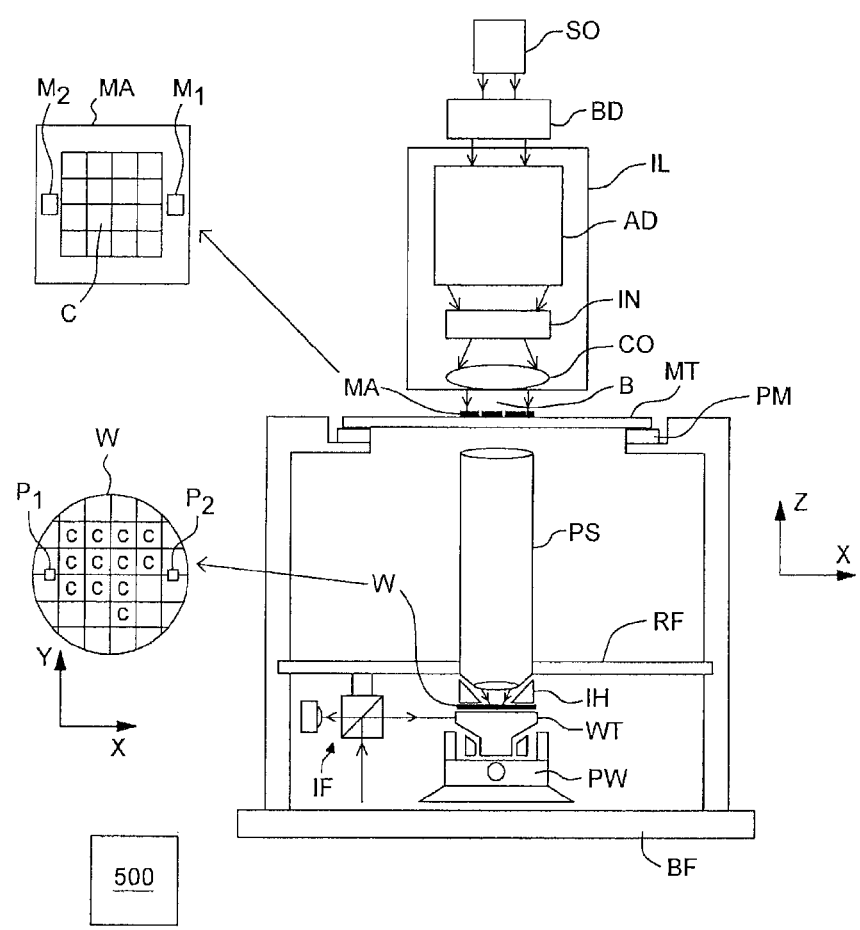
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "projection system" used herein should be broadly interpreted as encompassing any type of system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least part one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. Substrate W is held on the substrate table WT by a substrate holder according to an embodiment of the present invention and described further below. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatuses, a fluid, in particular a liquid, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin-film, of liquid on the substrate.

Four different types of localized liquid supply systems are illustrated in FIGS. 2 to 5. Any of the liquid supply devices of FIGS. 2 to 5 may be used in an unconfined system; however, sealing features are not present, are not activated, are not as efficient as normal or are otherwise ineffective to seal liquid to only the localized area.

Figure 2:
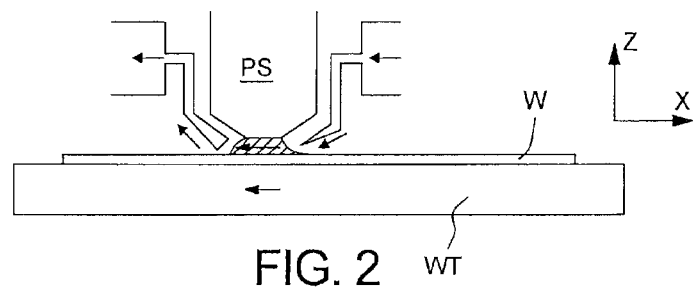
FIGS. 2 and 3 depict a liquid supply system for use in a lithographic projection apparatus.
Figure 3:
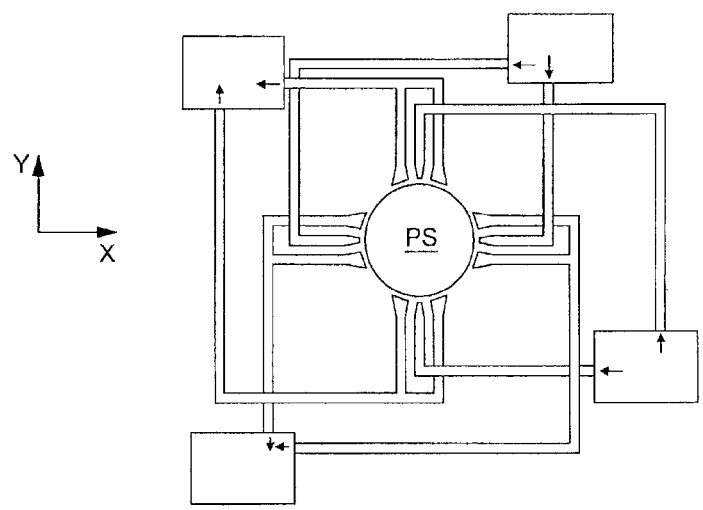

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
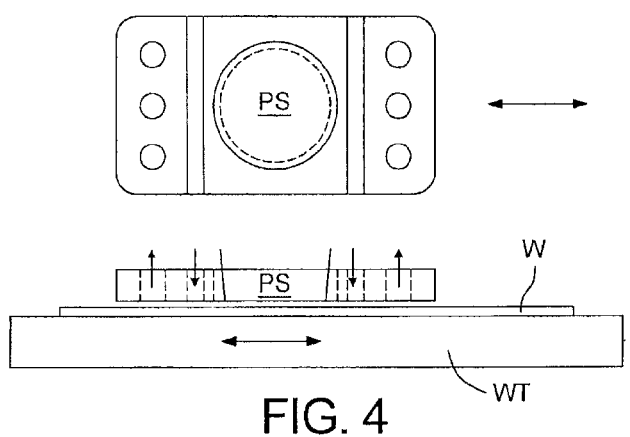
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin-film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in to inlets and out of outlets.

Figure 5:
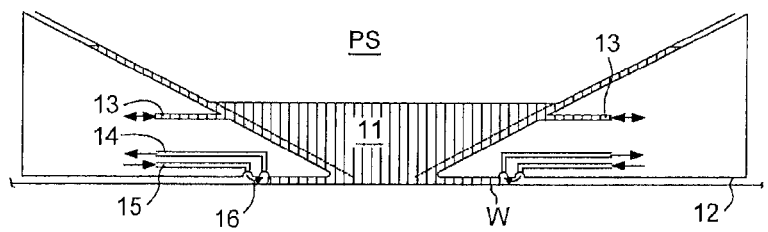
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane, though there may be some relative movement in the Z direction (in the direction of the optical axis). A seal is formed between the liquid confinement member and the surface of the substrate. In an embodiment, a seal is formed between the liquid confinement member and the surface of the substrate and may be a contactless seal such as a gas seal. Such a system is disclosed in United States patent application publication no. US 2004-0207824.

The fluid handling structure 12 includes a liquid confinement member and at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air, synthetic air, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

In order to control operations of the lithographic apparatus, a large number of sensors measuring conditions pertaining to the apparatus are provided. Such sensors may be used during calibration and/or maintenance of the apparatus, i.e. during down time, or during actual operations of the apparatus, for example during exposure, between exposures of target portions or between exposures of substrates. Many such sensors, for example radiation receiving sensors, include a transducer, e.g. a photodiode or camera, which generates an electrical signal in response to a stimulus, for example radiation falling on the sensor. Most, if not all, sensors generate heat during operation. Heat can be generated as a by-product of operation of the transducer, by electronics provided to process the output of the transducer, e.g. an amplifier or analog to digital converter, or by absorption of radiation, e.g. in the case of a sensor measuring a parameter of the projection beam.

A cooling arrangement may be provided to a sensor. For example, United States patent application publication no. US 2010/0259734 describes an arrangement to cool a detector module of a wavefront sensor to be used in a lithographic apparatus employing extreme ultraviolet radiation as the exposure radiation, by providing a gas in a gap between a casing of the sensor module and a heat sink. This arrangement serves to maintain the sensor module at a constant temperature independent of other parts of the apparatus. Also, in an immersion lithographic apparatus, a sensor provided in the upper surface of a substrate table can be cooled during operation by the immersion liquid.

However, existing approaches to cooling of a sensor that comes into contact with the immersion liquid in an immersion lithographic apparatus during operation may be inadequate and/or cause additional problems. An arrangement such as that disclosed in US 2010/0259734 which maintains a sensor at a constant temperature independent of other parts of the apparatus may result in the sensor being at a different temperature than the immersion liquid. In many cases, such a temperature difference will have no appreciable effect on the operation of the sensor itself. However, heat transfer between the immersion liquid and the sensor due to the temperature difference can cause an undesirable disturbance in the immersion liquid, e.g. turbulence and/or change in its refractive index. Similarly, using the temperature-conditioned immersion liquid to cool the sensor may result in disturbances caused by thermal transfer. An approach to addressing this problem would be to wait for the sensor and immersion liquid to come into thermal equilibrium before making measurements. However, such a delay may undesirably reduce throughput of the apparatus.

Accordingly, there is provided a sensor for a lithographic apparatus of the immersion type which, in operation, contacts the immersion liquid. The sensor has a temperature conditioning device, e.g. a cooling device, and a thermal path between a heat generating part of the sensor, e.g. a transducer or an electronic circuit, where the thermal resistance between the heat generating part and the temperature conditioning device is less than the thermal resistance between the heat generating part and the immersion liquid.

Figure 6:
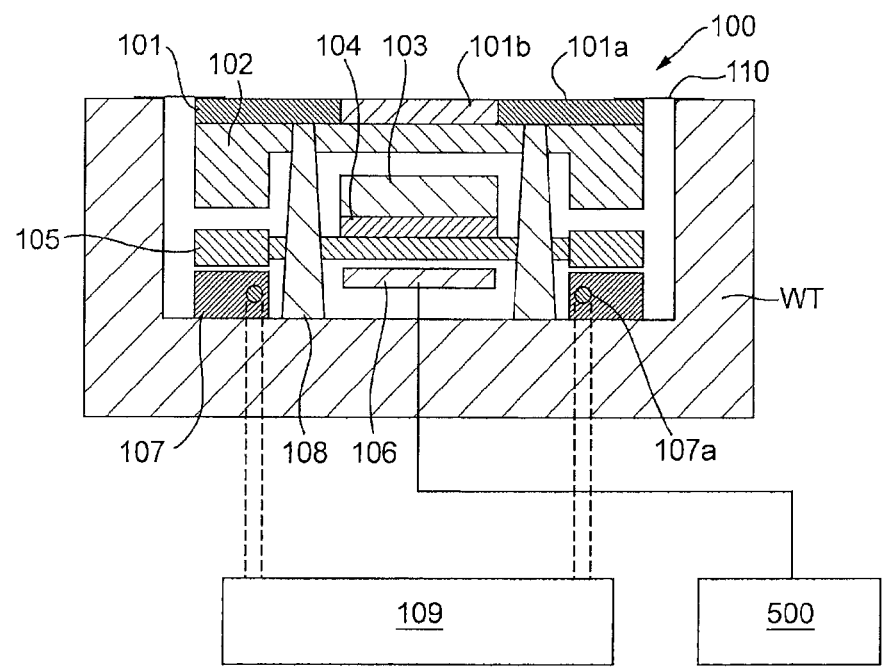
FIG. 6 depicts a sensor according to an embodiment of the invention.

FIG. 6 depicts in cross-section a sensor 100 according to an embodiment of the present invention. Sensor 100 is mounted in a recess in the substrate table WT or a measurement table (e.g., a mirror block or encoder block, which may be a part, such as an upper part, of a stage). A plate 101 (which may be referred to as a top plate) of sensor 100 has an upper surface 101*a* that is flush with the upper surface of the table. A seal 110, e.g. in the form of a sticker (also referred to as an adherable sheet member), covers any gap between plate 101 and the upper surface of the table. Plate 101 has a transparent portion 101*b* through which radiation, e.g. radiation from the projection beam, can reach a transducer 104. In an embodiment, the transparent portion 101*b* is transparent to ultraviolet radiation, e.g. deep ultraviolet radiation having a wavelength in the range from about 100 nm to 400 nm in particular 248 nm, 193 nm or 157 nm. In an embodiment of the invention, a grating or other reference pattern is formed in or on transparent portion 101*b*. In an embodiment, the whole of plate 101 is made of a transparent material. In an embodiment an opaque coating is applied to a surface of plate 101, the opaque coating having an opening to define transparent region 101*b*. An optical element 103, e.g. a fiber optic plate or micro lens array, is optionally provided to suitably direct or focus the radiation onto transducer 104. Transducer 104 can take the form of a device suitable to convert incident radiation to an electrical signal, for example a photodiode, CCD camera or CMOS camera.

The electrical signal generated by transducer 104 is processed by electronic circuit 106 and transmitted to controller 500. Controller 500 uses the electrical signal in control or calibration of the lithographic apparatus and its operation. In an embodiment of the invention electronic circuit 106 includes at least one of an amplifier, an analog to digital converter, a buffer memory, a control logic circuit, a modem and/or an interface. In an embodiment of the invention, communication between the electronic circuit 106 and the controller 500 is conducted using electronic signals passing along a wire, using radio waves or using an optical signal. Use of radio waves to transmit signals from the sensor to the controller 500, for example using a system conforming to a Bluetooth™ or WiFi™ standard, can reduce the number of physical connections to be provided to the sensor. Use of an optical signal to transmit signals between the electronic circuit 106 and controller 500, e.g. conducted via an optical fiber, can avoid interference if the environment of the sensor is electromagnetically noisy.

To ensure positional stability of sensor 100, sensor 100 is fixed to the table via, for example, one or more mounting feet 108. A support member 102, which may be in the form of a support ring, fixes plate 101 to the mounting foot 108 and provides desired rigidity to the plate 101. In an embodiment of the invention, accuracy of measurements by sensor 100 is affected by the positional stability of a grating provided in transparent portion 101*b* of plate 101 so that the support ring and mounting foot are designed to achieve the desired positional stability. A support member 105 is also mounted on mounting foot 108 and serves to support the transducer 104 and electronic circuit 106. In an embodiment, support member 105 is mounted on support ring 102 instead of mounting foot 108. In an embodiment, there are three mounting feet 108 arranged in a triangular formation with the transducer 106 mounted generally centrally within the triangle defined by the mounting feet 108. Mounting foot 108 is in the form of a pillar with a proximal end attached to the table and a distal end supporting support ring 102.

Support member 105 is attached to a medial portion of mounting foot 108 and takes the form of a generally circular plate extending outwardly of the mounting foot 108. Transducer 104 is supported on an outer surface of support member 105 facing towards the radiation beam. Electronic circuit 106 is supported on an inner surface of support member 105 facing towards the table.

A temperature conditioning device 107, e.g. in the form of a cooling circuit or ring, is mounted to the table outside mounting foot 108 and adjacent a peripheral part of mounting member 105. A temperature conditioned coolant, e.g. water, is circulated through conduit 107a provided within temperature conditioning device 107. The coolant is supplied by a coolant supply 109 and is desirably supplied at the substantially same temperature as the immersion liquid 11. In an embodiment, coolant supply 109 is a part of the liquid supply system to supply immersion liquid 11. In this way it may be unnecessary to provide additional temperature conditioning equipment. In an embodiment, liquid supply 109 is separate from the liquid supply arrangement for the immersion liquid 11. Such an arrangement can be advantageous if the immersion liquid is a different liquid with a lower heat capacity than, e.g., water. Coolant used to control the temperature of temperature conditioning device 107 need not have a particularly high purity and can be recycled. Therefore, use of a separate liquid supply system can reduce consumption of, e.g., ultra pure water. The coolant liquid may be recovered from the coolant circuit, reconditioned at least thermally in a coolant liquid handling system and returned to the coolant supply for resupply to the cooling circuit.

Figure 7:
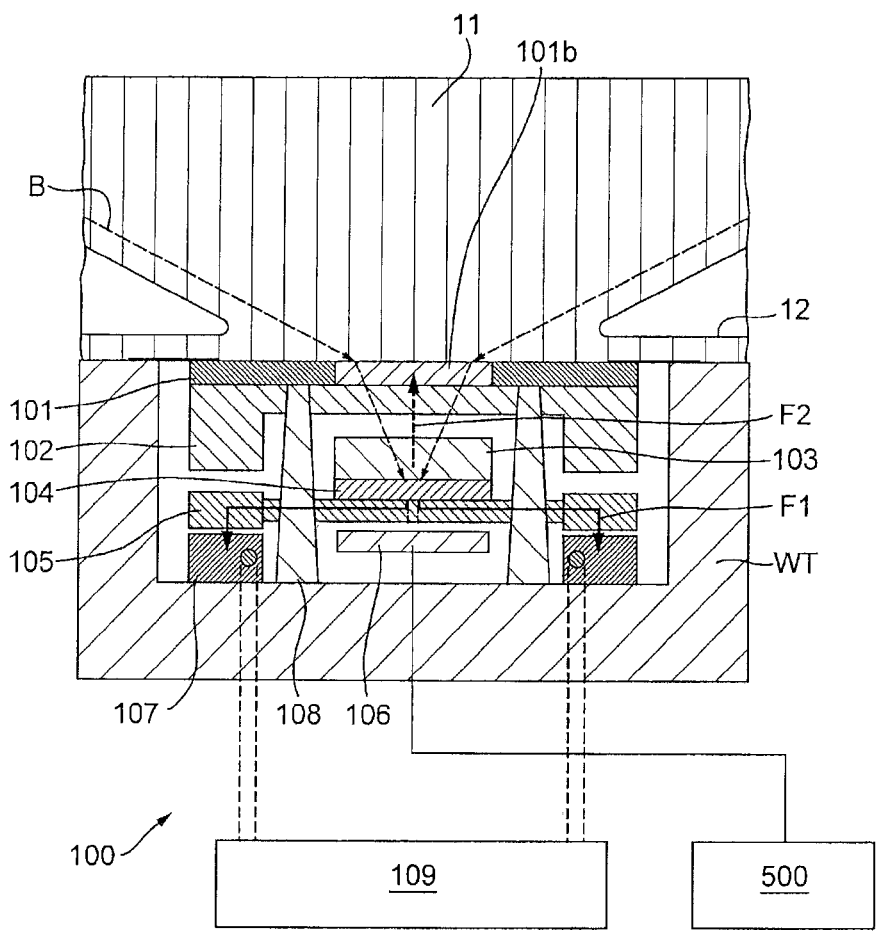
FIG. 7 depicts the sensor of FIG. 6 in use.

FIG. 7 depicts schematically the situation when the sensor 100 is in use to measure a property of the projection beam. The table (e.g., substrate table WT) is positioned underneath the projection system PS so that the projection beam B falls upon the transparent portion 101b of plate 101. At least a part of the projection beam passes through the transparent portion 101b, an aperture (not shown) in support ring 102, optical element 103 and is incident upon transducer 104. Transducer 104 outputs an electric signal that is dependent upon a property of the projection beam and/or its interaction with a pattern formed in the plate 101.

In an embodiment, sensor 100 is a spot sensor or an energy sensor and the signal output by transducer 104 is indicative of the intensity of the projection beam B. In an embodiment, sensor 100 is a transmission image sensor and the signal output by transducer 104 is indicative of a positional relationship between an image projected by the projection system and a reference pattern, e.g. a grating, formed in transparent portion 101b of plate 101. In an embodiment, sensor 100 is an interferometric sensor and the signal output by transducer 104 is indicative of a wavefront error in the projection beam B. In an embodiment, sensor 100 is a combined image sensor and interferometric sensor. The signal output by transducer 104 is indicative of either or both of a positional relationship between an image projected by projection system PS and a pattern formed on plate 101 and a wavefront error in projection beam B.

During operation of sensor 100, heat is generated in transducer 104 and/or electronic circuit 106. This heat can be generated as a by-product of the operation of the transducer, due to absorption of energy from the projection beam and/or by operation of the electronic circuit 106. In operation of the sensor 100 it will be in contact with immersion liquid 11 in order that the measurement made, e.g., accurately reflects conditions that will pertain during an exposure of a target portion of a substrate. A temperature difference between the immersion liquid 11 and transducer 104 and/or electronic circuit 106, e.g. caused by heat generated in transducer 104 and/or electric circuit 106, would cause a thermal transfer between immersion liquid 11 and sensor 100. Such a thermal transfer may create a temperature gradient in the immersion liquid in the vicinity of sensor 100. Such a temperature gradient may cause variation in the refractive index of the immersion liquid 11 and/or a convection current in the immersion liquid 11. Both variation in the refractive index and a convection current in the immersion liquid may be undesirable as potential sources of error in the measurement made by sensor 100.

Heat generated in transducer 104 and electric circuit 106 can flow through support member 105 to temperature conditioning device 107 as indicated by arrows F1 in FIG. 7. Such heat can also flow towards plate 101 and immersion liquid 11 as indicated by arrow F2. In an embodiment of the invention, the thermal resistance of the heat flow path F1 from transducer 104 to temperature conditioning device 107 is less than the thermal resistance of the heat flow path F2 from transducer 104 to immersion liquid 11. In this way, most of the heat generated in transducer 104 and/or electric circuit 106 flows to temperature conditioning device 107 and the amount of heat flowing to immersion liquid 11 is reduced or minimized. In an embodiment of the present invention the thermal resistance of heat flow path F1 is made low by forming support member 105 of a material having a high thermal conductivity, for example Al, AlN, Ti, Al—Si, SiSiC, SiC, any alloy of any combination thereof or a Fe—Ni alloy such as a nickel cobalt ferrous alloy. In an embodiment, the support member 105 is made of a metal coated with a layer of highly conductive material, such as pyrolytic graphite (also known as pyrolytic carbon). In an embodiment, support member 105 is formed of a material having a thermal conductivity greater than or equal to 100 W/m·K. In an embodiment the thermal conductivity of the support member 105 is greater than or equal to 10 W/m·K. In an embodiment, the thermal conductivity of the material of support member 105 is dependent on the thickness of support member 105. If the support member 105 is thicker a lower thermal conductivity may suffice.

In an embodiment, support member 105 has a substantial thermal capacity relative to the amount of heat generated in effecting a measurement cycle. In an embodiment, the thermal capacity of support member 105 is sufficiently large that the temperature rise of support member 105 during one cycle of measurements by the sensor 100 is less than 100 mK.

In an embodiment, support member 105 is separable from temperature conditioning device 107. With such an arrangement, sensor 100 may be dismounted from the table without disturbing the flow of coolant through temperature conditioning device 107. In this way, servicing and/or replacement of sensor 100 is made easier since the risk of spillage of coolant is reduced or minimized and it may be unnecessary to drain the coolant circuit. A thermally conductive paste can be provided between support member 105 and temperature conditioning device 107.

In an embodiment, the support member 105 and temperature conditioning device 107 are not in contact. Nevertheless, a contactless thermal coupling between support member 105 and temperature conditioning device 107 is provided. In such an embodiment, to increase or maximize the flow of heat from support member 105 to temperature conditioning device 107, the gap between them is made small (e.g. less than or equal to about 200 μm, desirably about 100 μm) and the areas of the opposing surfaces are large (e.g. greater than or equal to about 500 mm$^2$, desirably about 1000 mm$^2$). To that end, the opposing surfaces of support member 105 and temperature conditioning device 107 can be non-flat (e.g. non-planar or contoured). The opposing surfaces of support member 105 and temperature conditioning device 107 can be provided with corresponding contoured surfaces such that in an embodiment the surfaces may interleave for example the opposing surfaces may have one or more interleaving vanes. The opposing surfaces may have increased surface area and thermal coupling relative to two planar opposing surfaces. The support member 105 and temperature conditioning device 107 can have any convenient shape in plan. In an embodiment, temperature conditioning device 107 has a shape in plan that matches the shape of the support plate 105.

In an embodiment, liquid supply member 109 provides a continuous flow of coolant through temperature conditioner 107 whenever the apparatus is operating. In an embodiment, coolant flows through temperature conditioner 107 only when sensor 100 is in use or when required to help ensure the sensor 100 is thermally stable in use. In an embodiment, multiple sensors on the table are provided with temperature conditioning devices and a single coolant supply 109 provides coolant to each of them.

In an embodiment, one or more measures are taken to increase the thermal resistance of the heat flow path between transducer 104 and immersion liquid 11. Such a measure can include providing a gap e.g. a thermal gap or insulation layer between plate 101 and transducer 104 or optical element 103 (if present). The gap can be at least partially evacuated or filled with a gas having a low thermal conductivity. In an embodiment, the gap between plate 101 and transducer 104 or optical element 103 is provided with a refractive index matching medium to reduce reflection at the boundaries. In such an embodiment the refractive index matching medium is desirably selected to have a low thermal conductivity. The optical element 103 (if present), support ring 102 and plate 101 can be made of a material having a low thermal conductivity. In an embodiment, the mounting foot 108 is formed of a material having a low thermal conductivity and arranged to have a minimum cross-sectional area in a plan parallel to the top surface 101a of plate 101. In an embodiment, plate 101 is made of quartz, support ring 102 is made of quartz or fused silica and mounting foot 108 is made of Invar™ nickel iron alloy (e.g., FeNi36 or 64FeNi).

Figure 8:
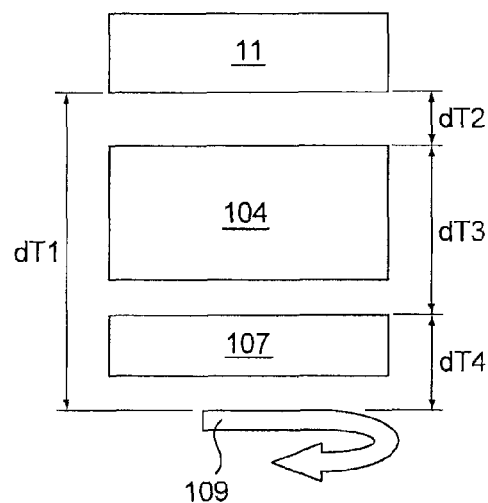
FIG. 8 depicts temperature differences occurring in use of the device.

Temperature differences that might occur in use of a sensor of an embodiment are depicted in FIG. 8. The difference in temperature between the immersion liquid 11 and the coolant supply 109 is the temperature difference dT1. The difference between the immersion liquid 11 and transducer 104 is the temperature difference dT2. The difference in temperature between transducer 104 and temperature conditioning device 107 is the temperature difference dT3 and that between temperature conditioning device 107 and coolant supply 109 is the temperature difference dT4. It is desirable to reduce or minimize the temperature difference dT2, for example in order to reduce or minimize disturbance in the immersion liquid 11 due to heat conduction from the transducer 104.

When transducer 104 is operating, the temperature differences dT3 and dT4 will be positive, i.e. transducer 104 is at a higher temperature than temperature conditioning device 107. The temperature conditioning device 107 is in turn at a higher temperature than coolant supply 109. To reduce or minimize the temperature difference dT2, a potential solution would appear to be to make dT1 negative, i.e. to make coolant supply 109 have a lower temperature than immersion liquid 109. However, when transducer 104 is not operating, the temperature differences dT3 and dT4 would tend towards zero and the transducer 104 would end up at a lower temperature than immersion liquid 11. This could have just as a deleterious effect as the temperature of transducer 104 being higher than that of the immersion liquid 11.

Figure 9:
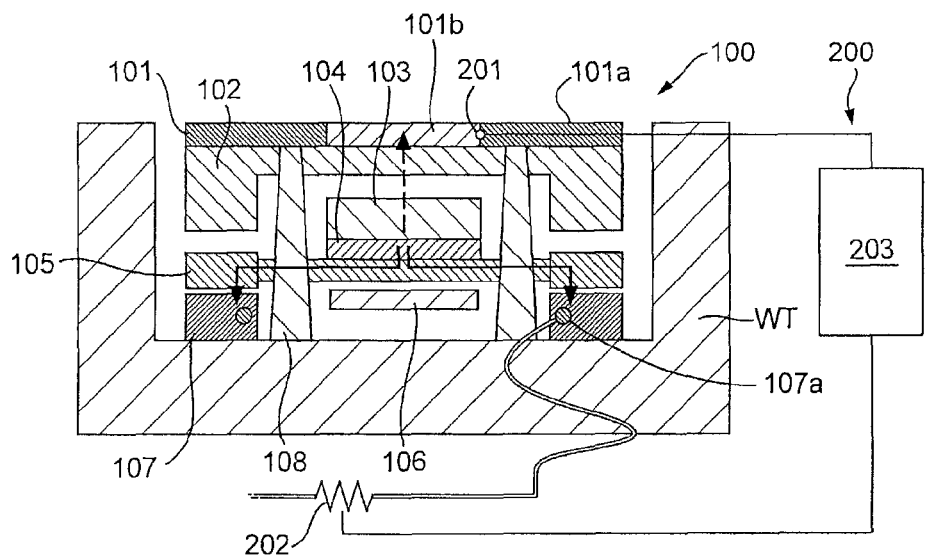
FIG. 9 depicts a sensor according to an embodiment of the invention.

In an embodiment of the invention shown in FIG. 9, a control system 200 is provided to control the temperature of the sensor 104 actively.

As shown, a temperature sensor 201 is provided in or on plate 101, for example adjacent transparent portion 101b. Alternatively or additionally, a temperature sensor 201 is provided in one or more of the following locations: on the underside of plate 101; in or on the support ring 102, which is in thermal contact with the plate 101; and/or in, on or between the optical element 103 and mounting foot 108. It is also possible to locate the temperature sensor 201 in or on transducer 104. Desirably the temperature sensor 201 is as close as possible to the path of beam B when the sensor is in use but without obscuring or interfering with the beam B. In an embodiment, multiple temperature sensors 201 are provided at different points in sensor 100. Using multiple sensors has an advantage in that it allows for compensation for a temperature gradient in the plate 101 and local cold spots. In an embodiment, temperature sensor 201 is a negative temperature coefficient device (e.g. a thermistor), a thermocouple or a resistance temperature sensor. Any device capable of measuring the temperature of a surface of plate 101 can be used.

A heater 202, e.g. a resistive heater, a Peltier device, a flexible resistive heater insulated by polyimide film (commonly referred to as a Kapton™ heater), glow wire, thin film heater or other heat-dissipating device, is provided to heat the flow of heat transfer medium (e.g. coolant) from coolant supply 209 to conditioning device 107. Desirably, heater 202 is capable of outputting heat at a similar or greater rate than the heat output of transducer 104. In an embodiment, more than one heater 202 is provided, with the total heat output of the heaters 202 being similar to, or greater than, the heat output of transducer 104. In an embodiment with multiple heaters, the heaters may be located in multiple locations in the conditioning device. More than one type of heater may be used.

A controller 203 is connected to temperature sensor(s) 201 and heater(s) 202. The controller 203 controls heater(s) 202 so as to maintain the temperature of a surface (e.g., upper surface) of plate 101 at a desired set-point, e.g. substantially the same as the temperature of the immersion liquid 11. To control the heater(s) 202, the controller 203 uses the signal from the sensor(s) 201 indicative of the temperature measured by the sensor(s) 201. Controller 203, in an embodiment, takes account of an offset between the temperature measured by temperature sensor(s) 201 and the temperature of the surface of plate 101, which can be derived by calibration. In an embodiment, controller 203 is a PID (Proportional/Integral/Derivative) controller or other simple feedback controller. In an embodiment, controller 203 controls the output of heater(s) 202 between multiple different heat outputs or by controlling the duty cycle of heater(s) 202.

Figure 10:
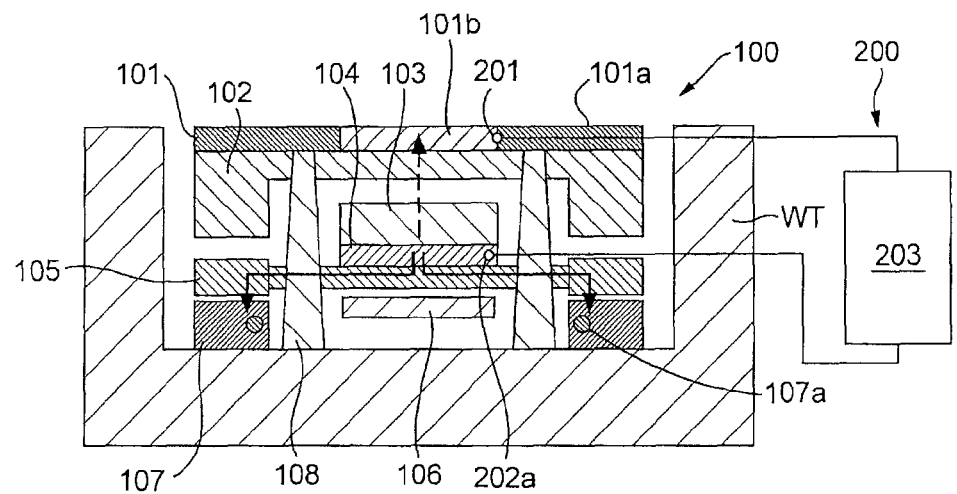
FIG. 10 depicts a sensor according to an embodiment of the invention.

In an embodiment of the invention, depicted in FIG. 10, heater 202a is provided in transducer 104 itself. Heater 202a can be a separate component within transducer 104. Heater 202a can be the transducer itself. Otherwise, the embodiment of FIG. 10 is the same as the embodiment of FIG. 9. The controller 203 (not shown in FIG. 10) can be used to operate the heater 202a in the same way as the controller 203 is used to control the heater 202 in the embodiment of FIG. 9. When the heater 202a is the transducer 104, the controller can be used to operate the transducer to emit heat, when heat is desired, when no measurement is to be made, e.g. performing a dummy measurement using the transducer 104. As well as operating the heater, the controller 203 receives signals from the transducer 104 indicative as to when the transducer is operational so that the controller can operate the transducer to generate the desired heat. Thus the controller 203 operates the transducer 104 to generate the desired heat, accounting for the heat generated by use of the transducer 104 as a transducer.

Figure 11:
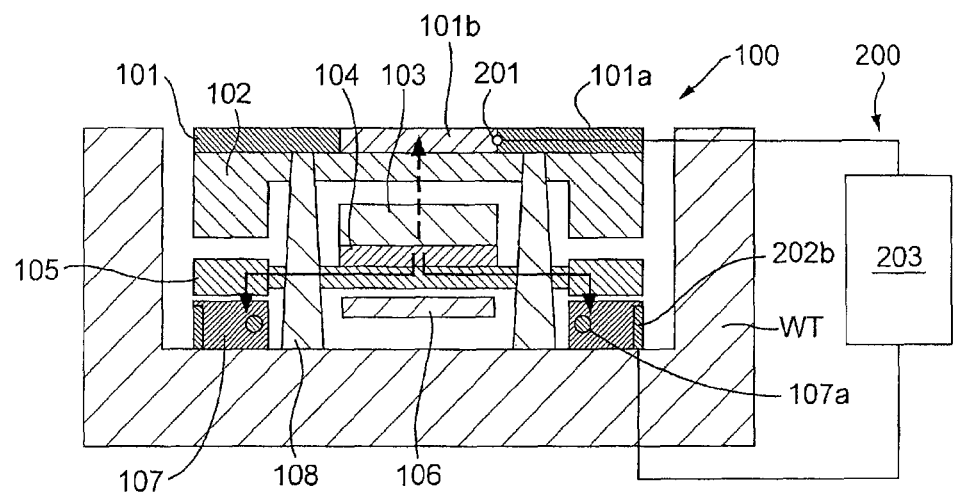
FIG. 11 depicts a sensor according to an embodiment of the invention.

In an embodiment of the invention, depicted in FIG. 11, heater 202b is mounted in or on temperature conditioning device 107. The sensor 201 is located at the plate 101. In this embodiment, multiple separate heaters 202 which are separately controllable by controller 203 can be positioned around the temperature conditioning device 107. The heater 202 may take the form of one more thin film heaters which are disclosed in, for example, United States patent application publication no. US 2011-0222033, which is hereby incorporated by reference in its entirety. Otherwise, the embodiment of FIG. 11 is the same as the embodiment of FIG. 9.

An embodiment as described with reference to FIG. 9 or FIG. 11 can be used even where the transducer 104 is a passive device that does not generate heat in use. In such circumstances, the embodiment can be used to compensate for a temperature difference arising from a cause other than heat dissipation by the sensor 100. For example, immersion liquid might evaporate from a surface of plate 101 at a different rate than it evaporates from the remainder of substrate table WT or the substrate W, thus causing the sensor 100 to cool at a different rate than the remainder of substrate table WT or the substrate W.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of from 5 to 20 mm).

The term "lens", where the context allows, may refer to any one or combination of various types of optical components, including refractive and reflective optical components.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more multiple processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm or 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid. The invention can also be applied to non-immersion lithography apparatus.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an aspect of the invention there is provided: a sensor for use in a lithographic apparatus of an immersion type, the sensor comprising: a member that, in use of the sensor, contacts an immersion liquid supplied to a space adjacent an element of a projection system; a transducer configured to convert a stimulus to an electric signal; and a temperature conditioning device, wherein a first heat flow path between the transducer and the temperature conditioning device has a lower thermal resistance than a second heat flow path between the transducer and the immersion liquid.

The transducer may be mounted on a support member, the support member providing a thermal path between the transducer and the temperature conditioning device. The support member may be formed of a material having a thermal conductivity greater than or equal to 10 W/m·K, desirably greater than or equal to 100 W/m·K. The support member may be formed of at least one material selected from the group consisting of Al, AlN, SiSiC, SiC, Ti, Al—Si and an alloy containing Fe and Ni. The transducer may be mounted on a face of the support member that faces towards the immersion liquid. The sensor may further comprise an electric circuit configured to receive the electric signal generated by the transducer. The electric circuit may be mounted on a surface of the support member that faces away from the immersion liquid, wherein the first heat flow path also conducts heat generated by the electric circuit to the temperature conditioning device.

The transducer may be at least one selected from the group consisting of a photodiode, a charge coupled device, a camera and a CMOS camera. The member may include a window that is transparent. The window may be transparent to ultraviolet radiation having a wavelength in the range of from about 100 to about 400 nm. An opaque pattern, e.g. a grating, may be provided in or on the transparent window.

A gap and/or a thermally insulating layer may be present between the transducer and the member. The temperature conditioning device may comprise a body having defined therein a conduit to circulate a heat transfer medium. The temperature conditioning device and the transducer may be contactlessly thermally coupled.

In an aspect of the invention there is a sensor for use in an immersion lithographic apparatus, the sensor comprising: a surface of a member that, in use of the sensor, contacts an immersion liquid supplied to a space adjacent an element of a projection system; a transducer configured to convert a stimulus to an electric signal; and a temperature conditioning device, wherein the transducer is thermally coupled to the temperature conditioning device and the transducer is thermally isolated from the surface of the member.

In an aspect of the invention there is a sensor for use in an immersion lithographic apparatus, the sensor comprising: a surface of a member that, in use of the sensor, contacts an immersion liquid supplied to a space adjacent an element of a projection system; a transducer configured to convert a stimulus to an electric signal; and a temperature conditioning device, wherein the transducer has greater thermal coupling to the temperature conditioning device than the transducer to the surface of the member.

In an aspect of the invention there is a sensor for use in an immersion lithographic apparatus, the sensor comprising: a surface of a member that, in use of the sensor, contacts an immersion liquid supplied to a space adjacent an element of a projection system; a transducer configured to convert a stimulus to an electric signal; and a temperature conditioning device, wherein the transducer has greater thermal isolation from the surface of the member than from the temperature conditioning device.

The sensor of any of the aspects of the invention may further comprise a control system configured to control the temperature of the member. The control system may comprise a temperature sensor arranged to generate a temperature signal indicative of the temperature of the member, a heater arranged to generate heat and a controller arranged to control the heater in response to the temperature signal. The heater may be arranged to heat a heat transfer medium that transfers heat to or from the temperature conditioning device. The heater may be arranged to heat the temperature conditioning device. The transducer may be arranged to function as, or comprises, the heater under control of the controller.

In an aspect of the invention there is a lithographic apparatus, comprising: a projection system configured to project a beam patterned by a patterning device onto a substrate; a substrate table configured to support the substrate; a liquid supply system configured to provide a liquid to a space between the projection system and the substrate table; and a sensor according to any of the aforementioned aspects of the invention.

The sensor may be mounted to the substrate table. The sensor may be mounted in a recess in a surface of the substrate table that faces the projection system. The sensor may be at least one sensor selected from the group consisting of a spot sensor, an energy sensor, an interferometric sensor, an image sensor and a combined interferometric and image sensor.

In an aspect of the invention there is a device manufacturing method using a lithographic apparatus, the method comprising: projecting a beam patterned by a patterning device onto a substrate using a projection system while providing a liquid to a space between the projection system and the substrate; and sensing a parameter of the lithographic apparatus or of the projecting using a sensor according to any of the aforementioned aspects of the invention relating to a sensor.

The descriptions above are intended to be illustrative, not limiting. Thus, it will be apparent to one skilled in the art that modifications may be made to the invention as described without departing from the scope of the claims set out below.

The invention claimed is:

1. A support structure for use in a lithographic apparatus of an immersion type, the support structure comprising:
    a sensor system comprising:
        a member that, in use of the sensor system, contacts an immersion liquid supplied to a space adjacent an element of a projection system, and
        a transducer configured to convert a stimulus to an electric signal;
    a temperature conditioning device configured to thermally condition the transducer; and
    a support body configured to hold the sensor system and the temperature conditioning device,
    wherein, when the transducer is installed adjacent the temperature conditioning device, the transducer is separated by a gap from the temperature conditioning device and is configured such that the temperature conditioning device can remain in or on the support body when the transducer is uncoupled from the temperature conditioning device.

2. The support structure according to claim 1, wherein the transducer is mounted on a support member, the support member providing a thermal path between the transducer and the temperature conditioning device.

3. The support structure according to claim 2, further comprising an electric circuit configured to receive the electric signal generated by the transducer and the electric circuit is mounted on a surface of the support member that faces away from the immersion liquid, wherein a heat flow path conducts heat generated by the electric circuit to the temperature conditioning device.

4. The support structure according to claim 2, wherein the transducer is mounted on a face of the support member that faces towards the immersion liquid.

5. The support structure according to claim 1, wherein a gap and/or a thermally insulating layer is present between the transducer and the member.

6. The support structure according to claim 1, wherein the temperature conditioning device and the transducer are thermally coupled.

7. The support structure according to claim 1, wherein the gap comprises a thermally conductive paste.

8. The support structure according to claim 1, wherein a heat flow path between the transducer and the temperature conditioning device has a higher thermal conductivity than a heat flow path between the transducer and the immersion liquid.

9. A lithographic apparatus, comprising:
   a projection system configured to project a beam patterned by a patterning device onto a substrate;
   a movable table;
   a liquid supply system configured to provide a liquid to a space between the projection system and the table; and
   the support structure according to claim 1, wherein the support structure is at least part of the table and the temperature conditioning device is affixed to the table.

10. A support structure for use in a lithographic apparatus of an immersion type, the support structure comprising:
    a sensor system comprising:
       a member that, in use of the sensor system, contacts an immersion liquid supplied to a space adjacent an element of a projection system, and
       a transducer configured to convert a stimulus to an electric signal;
    a temperature conditioning device; and
    a support body configured to hold the sensor system and the temperature conditioning device,
    wherein the transducer is configured such that the temperature conditioning device can remain in or on the support body when the transducer is uncoupled from the temperature conditioning device.

11. The support structure according to claim 10, wherein the transducer is mounted on a support member, the support member providing a thermal path between the transducer and the temperature conditioning device.

12. The support structure according to claim 11, further comprising an electric circuit configured to receive the electric signal generated by the transducer and the electric circuit is mounted on a surface of the support member that faces away from the immersion liquid, wherein a heat flow path conducts heat generated by the electric circuit to the temperature conditioning device.

13. The support structure according to claim 11, wherein the transducer is mounted on a face of the support member that faces towards the immersion liquid.

14. The support structure according to claim 10, wherein the temperature conditioning device and the transducer are contactlessly thermally coupled.

15. The support structure according to claim 10, wherein a gap between the transducer and the temperature conditioning device comprises a thermally conductive paste.

16. The support structure according to claim 10, wherein a heat flow path between the transducer and the temperature conditioning device has a higher thermal conductivity than a heat flow path between the transducer and the immersion liquid.

17. The support structure according to claim 10, wherein a gap and/or a thermally insulating layer is present between the transducer and the member.

18. A lithographic apparatus, comprising:
    a projection system configured to project a beam patterned by a patterning device onto a substrate;
    a movable table;
    a liquid supply system configured to provide a liquid to a space between the projection system and the table; and
    the support structure according to claim 10, wherein the support structure is at least part of the table and the temperature conditioning device is affixed to the table.

19. A device manufacturing method using a lithographic apparatus, the method comprising:
    projecting a beam patterned by a patterning device onto a substrate using a projection system while providing a liquid to a space between the projection system and the substrate; and
    sensing a parameter of the lithographic apparatus or of the projecting using a sensor system comprising:
       a member that, in use of the sensor system, contacts an immersion liquid supplied to a space adjacent an element of a projection system, and
       a transducer configured to convert a stimulus to an electric signal,
    wherein a support body of the lithographic apparatus holds the sensor system and a temperature conditioning device configured to thermally condition the transducer, and
    wherein the transducer is installed adjacent the temperature conditioning and is configured such that the temperature conditioning device can remain in or on the support body when the transducer is uncoupled from the temperature conditioning device.

20. The method according to claim 19, wherein the temperature conditioning device and the transducer are contactlessly thermally coupled or a gap between the transducer and the temperature conditioning device comprises a thermally conductive paste.

\* \* \* \* \*